United States Patent [19]

Dollard et al.

[11] Patent Number: 4,521,886
[45] Date of Patent: Jun. 4, 1985

[54] QUASI-SOFT DECISION DECODER FOR CONVOLUTIONAL SELF-ORTHOGONAL CODES

[75] Inventors: Peter M. Dollard, Highlands; William Turin, Morganville, both of N.J.

[73] Assignee: AT&T Bell Laboratories, Murray Hill, N.J.

[21] Appl. No.: 511,852

[22] Filed: Jul. 8, 1983

[51] Int. Cl.³ .............................................. G06F 11/10
[52] U.S. Cl. ..................................................... 371/43
[58] Field of Search .............................. 371/43, 44, 45

[56] References Cited

U.S. PATENT DOCUMENTS

| | | | |
|---|---|---|---|
| 3,227,999 | 1/1966 | Hagelbarger | 371/37 |
| 3,439,334 | 4/1966 | Massey | 371/43 |
| 3,508,197 | 4/1970 | Tong | 371/45 |
| 3,568,148 | 3/1971 | Clark, Jr. | 371/37 |
| 3,605,090 | 9/1971 | Burton | 371/43 |
| 4,322,848 | 3/1982 | Snyder, Jr. | 371/43 |
| 4,404,674 | 9/1983 | Rhodes | 371/43 |
| 4,476,458 | 10/1984 | Dollard | 371/43 X |

OTHER PUBLICATIONS

W. W. Wu, New Convolutional Codes—Part I, IEEE Transactions on Comm., vol. COM-23, No. 9, Sep. 1975, pp. 942-955.
W. W. Wu, New Convolutional Codes—Part II, IEEE Transactions on Comm., vol. COM-24, No. 1, Jan. 1976, pp. 19-33.
W. W. Wu, New Convolutional Codes—Part III, IEEE Trans. on Comm., vol. COM-24, No. 9, Sep. 1976, pp. 946-955.

*Primary Examiner*—Charles E. Atkinson
*Attorney, Agent, or Firm*—Erwin W. Pfeifle

[57] ABSTRACT

The present invention relates to a quasi-soft decision decoder for convolutional self-orthogonal codes which includes a multistage syndrome register, a bit detection means, parity check means and threshold logic gates. The bit detection means is augmented to render a "quality" bit in conjunction with each detected data bit which indicates the quality of the received signal level for that bit when compared with a predetermined threshold signal level. Memory storage is provided for storing the quality bits in parallel with memory storage for the data bits. Each of the threshold logic gates includes a separate group of active inputs from the syndrome register plus an associated one of the quality bits, each gate being arranged to generate an information correction bit which is dependent on a predetermined threshold level of corresponding input signals. The quality bit, therefore, provides an additional vote in the decision of whether a suspect data bit is erroneous or not.

4 Claims, 1 Drawing Figure

QUASI-SOFT DECISION DECODER FOR CONVOLUTIONAL SELF-ORTHOGONAL CODES

BACKGROUND OF THE INVENTION

1. Field of the Invention

The present invention relates to a quasi-soft decision decoder for convolutional self-orthogonal codes, and, more particularly, to a decoder including a demodulator which is augmented to render a quality bit in conjunction with each detected data bit. The quality bit provides an additional vote in the decision of whether a data bit is erroneous or not.

2. Description of the Prior Art

Two systematic procedures are known for threshold decoding of a redundant sequence which includes information signals encoded in accordance with a convolutional, self-orthogonal code. One of these procedures, defined as direct decoding, is embodied in the error-correcting system disclosed in U.S. Pat. No. 3,227,999 issued to D. W. Hagelbarger on Jan. 4, 1966. There, each decoding correction made with respect to an information signal is not fed back to change the nature of a stored syndrome or error pattern representation. If such a change were made, the decoding of subsequently processed information signals would be directly influenced. In other words, in direct decoding there is no feedback connection in the decoding circuitry. Hence, an erroneous decision by the decoder cannot lead to other faulty decisions in subsequent processing. In effect, a positive immunity against error propagation in the decoding process is thereby achieved, but at the expense of reduced error-correcting capabilities.

The other available procedure for processing convolutional self-orthogonal codes is known as feedback decoding. As disclosed in U.S. Pat. No. 3,439,334 issued to J. L. Massey on Apr. 15, 1969, each decoding correction made not only corrects the information bit but is also fed back to the syndrome register to correct, rightly or wrongly, the affected bits of the syndrome register. It is apparent that in a feedback decoder, a bad decoding decision can introduce additional errors in the decoding process.

In conclusion, the prior art decoders for convolutional self-orthogonal codes are usually one of two types: direct decoders or feedback decoders providing hard and soft decision capabilities, respectively.

The problem remaining in the prior art is to provide a decoder which provides reduction in error clustering and better Bit Error Rate (BER) than the hard decision decoding technique, and with reduced cost and complexity from that found in conventional soft decision decoders.

SUMMARY OF THE INVENTION

The problem remaining in the prior art has been solved in accordance with the present invention, which relates to a quasi-soft decision decoder for convolutional self-orthogonal codes and, more particularly, to a decoder including a demodulator which is augmented to render a quality bit in conjunction with each detected data bit. The quality bit provides an additional vote in the decision of whether a data bit is erroneous or not.

It is an aspect of the present invention to provide a quasi-soft decision decoder which includes a multistage syndrome register, a demodulator, parity check means and threshold logic gates. The demodulator is augmented to render a quality bit in conjunction with each detected data bit. Memory storage is provided for storing the quality and detected data bits in parallel with each other. Inputs to each threshold logic gate include a predetermined set of bits from the syndrome register plus an associated one of the quality bits, with the gates adjusted to a predetermined threshold. The quality bit provides an additional vote in the decision of whether a suspect data bit is in fact erroneous.

Other and further aspects of the present invention will become apparent during the course of the following description and by reference to the accompanying drawings.

BRIEF DESCRIPTION OF THE DRAWINGS

Referring now to the drawings.

DETAILED DESCRIPTION

Figure 1:
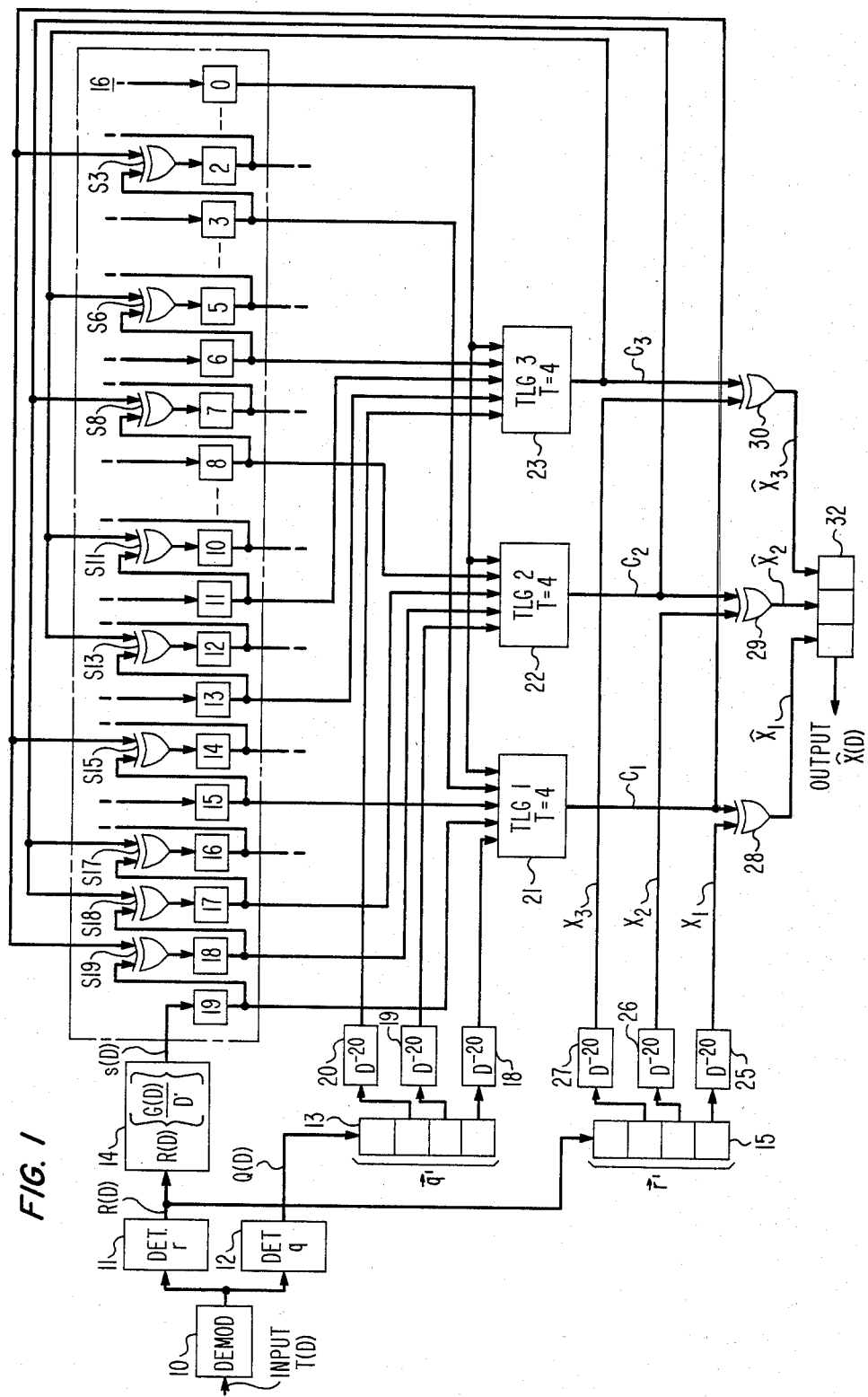
FIG. 1 is a block diagram of an exemplary decoder for self-orthogonal codes in accordance with the present invention.

In convolutional coding schemes, groups of m code bits are transmitted during a given time interval, where a given group of m code bits include k data bits and $(m-k)$, or p, parity bits. In contrast with block codes which generate m code bits in a particular time span based only upon the k data bits from the corresponding time interval, convolutional codes generate m code bits based upon both the k data bits from the corresponding time interval and a subset of the $(N-1)k$ data bits from the $(N-1)$ previous time intervals. The parameter N, multiplied by m, gives the constraint length of the code, that is, $K=Nm$. A code rate, r, is defined as the ratio of the data bits to total bits transmitted per group, or $r=k/m$. Codes of the type exemplified are systematic, in that the data bits retain their original form with the parity bits appended to each group. Upon reception, the data bits and the parity bits (either or both perhaps containing transmission errors) and incorporated into a set of equations called syndrome equations. The solution to these syndrome equations are then used by the decoder to estimate the error locations among the received data bits. Several techniques exist in the art for generating these syndrome equations and are discussed in the book "Threshold Decoding" by J. L. Massey (M.I.T) Press, Cambridge, Mass., 1963.

FIG. 1 illustrates an exemplary decoder in accordance with the present invention for decoding a convolutional self-orthogonal code with the parameters $k=3$, $m=4$, and $J=4$, where J is the number of parity bits affected by each data bit. It is to be understood that the use of these parameters is for exemplary purposes only and not for purposes of limitation since other sets of parameters can be substituted and the arrangement of FIG. 1 modified to accommodate such parameters.

For a clear understanding of the following description of the functioning of FIG. 1, it is to be understood that the code generator for the exemplary convolutional self-orthogonal code for $k=3$, $m=4$, and $J=4$ is defined by:

$$G(D) = \begin{vmatrix} D^0 + D^3 + D^{15} + D^{19} \\ D^0 + D^8 + D^{17} + D^{18} \\ D^0 + D^6 + D^{11} + D^{13} \end{vmatrix} \quad (1)$$

Any such code with $J=2t$ is t-error correcting. The encoder at a remote transmitter formats the data into a sequence, X(D), of k-bit groups and generates the transmit sequence:

$$T(D) = X(D)[I \mid G(D)] \qquad (2)$$

which is transmitted over a channel to the arrangement of FIG. 1. In encoding this exemplary ¾ code rate convolutional self-orthogonal code (CSOC), a single parity bit is appended to each group of three unaltered data bits from an encoder, and the four-channel-bit code groups are then transmitted in sequence. Each parity bit is a parity check on 12 data bits, which include the three data bits from the current group plus one data bit from each of selected ones of nine prior groups. Each data bit contributes to the parity bit of its own group, and is retained in memory to contribute to the parity bit in each of three future groups, thus each data bit affects the value of four parity bits. However, no two data bits, whether different bits in the same group, corresponding bits in different groups, or different bits from different groups, affect more than a single common parity bit. This is known as the "self-orthogonal" property.

In the arrangement of FIG. 1, an exemplary ¾ code rate CSOC input analog signal is received at, for example, IF or RF frequencies at the input to a demodulator 10. Demodulator 10 functions to downconvert, if necessary, the received signal to, for example, baseband and convert the analog input signal to a digital output signal. A detector section 11 detects the exemplary three data bits and one parity bit of each received exemplary 4-bit group and generates an output signal designated R(D) which includes the four sequential bits and is defined by:

$$R(D) = T(D) + E_c(D) \qquad (3)$$

where $E_c(D)$ is the channel error sequence occurring in the channel between the remote transmitter of the encoded signal and the receiver including the arrangement of FIG. 1. A second detector section 12 functions to compare each received bit signal level with a predetermined threshold level to determine the "quality" of each received bit. In other words, detector section 12 generates, for example, a "1" if the received bit has an amplitude which is equal to or less than a predetermined threshold and a "0" if the received bit has an amplitude which is above said threshold. The quality bit sequence, Q(D), from detector section 12 is transmitted serially (bit by bit) to the input of a 4-bit register 13 which reformats Q(D) into groups and performs a serial to parallel conversion. At the end of each group-rate clock interval, the quality indications for the 3 data bits of the group are in the 3 locations designated q' in register 13 and the quality indication of the associated parity bit is in the remaining (top) location. At that instant, the 3 bits of q' are fed in parallel to the memory storage registers 18–20, while the quality indication of the associated parity bit is discarded.

The channel bit sequence R(D), from detector section 11 is transmitted serially to the inputs of both a syndrome generator 14 and a 4-bit register 15, the latter of which reformats R(D) into groups and performs a serial to parallel conversion. At the end of each group-rate clock interval, the 3 data bits of that group are in the 3 locations designated r' in register 15, and the associated parity bit is in the remaining (top) location. At that instant, the 3 bits of r' are fed in parallel to the memory storage registers 25–27, while the associated parity bit is discarded. Note that by then, the parity bit already has been transmitted separately to the syndrome generator 14 to perform its function in the syndrome computation.

Syndrome generator 14 is responsive to the output signal from detector section 11 to generate a syndrome sequence, s(D), given by:

$$s(D) = R(D) \left| \frac{G(D)}{1} \right| = E_c(D) \left| \frac{G(D)}{1} \right| \qquad (4)$$

which syndrome sequence s(D) is clocked and stored at the group rate in a syndrome shift register 16 which for this example is capable of storing 20 bits. More particularly, syndrome generator 14 generates one syndrome bit for each received 4-bit group that indicates whether the channel transmission errors (if any) which have occurred among the 12 data bits and the one parity bit affecting that syndrome bit are odd or even in number. For example, syndrome generator 14 will generate a "1" for storage beginning in storage location 19 of syndrome shift register 16 if that number of channel errors was odd, and will generate a "0" for storage beginning in storage location 19 of syndrome register 16 if that number of channel errors was even or zero.

Each of the three quality bits stored in the three memory storage registers 18–20 is transmitted to the corresponding one of three Threshold Logic Gates (TLG) 21–23, respectively. The delay provided by each of the three memory storage registers 18–20 is equal to 20 clock cycles to ensure that all four syndrome bits from syndrome register 16 affected by any one data bit have been accumulated in syndrome register 16 at the time a decision on that particular data bit is to be rendered. In a similar manner, each of the three data bits stored in the three memory storage registers 25–27 is transmitted to the corresponding one of three EXCLUSIVE-OR gates 28–30, respectively. Memory storage registers 25–27 similarly provide a delay of 20 clock cycles to ensure that the decision made by the TLGs 21–23 will affect the corresponding data bit in EXCLUSIVE-OR gates 28–30, respectively.

More particularly, the first to third data bits of a 4-bit group at the output from detector section 11 will be stored in memory storage registers 25–27, respectively. Concurrent therewith, syndrome generator 14 performs a syndrome computation on the 4-bit group (in conjunction with the designated 9 earlier data bits) and stores the result beginning in bit location 19 of syndrome register 16. At the same time, detector section 12 determines the quality of each of the three data bits and the associated parity bit and stores an indication of such quality for the data bits only, in memory storage registers 18–20, respectively. In accordance with Equation (1), the syndrome bits which are affected by the first data bit of the 4-bit group are syndrome bits 0, 3, 15 and 19 and, therefore, these bits must be available to make a decision about the accuracy of this first data bit. As a result, after 20 clock cycles the syndrome bit originally stored in location 19 of syndrome register 16 is now temporarily stored in syndrome register 16 location 0 with all the other necessary syndrome bits being available in syndrome register locations 3, 15 and 19 to permit a decision to be made on this first data bit in TLG 21. Additionally, in accordance with the present invention, the quality bit from memory storage register 18 associated with the first data bit on which a decision is to be rendered is also used by TLG 21 concurrent with the 0, 3, 15 and 19 syndrome bits in its decision making process.

Concurrent with the decision making process in TLG 21, from Equation (1), TLG 22 uses syndrome bits 0, 8, 17 and 18 and the associated quality bit from memory storage register 19, which are concurrently inputted to TLG 22, to make a decision about the second data bit originally received in the above-mentioned 4-bit group. Similarly, TLG 23 uses syndrome bits 0, 6, 11 and 13 and the associated quality bit from memory storage register 20, which are concurrently inputted to TLG 23, to make a decision about the third data bit originally received in the above-mentioned 4-bit group. In accordance with the present invention, each of TLG 21-23 includes an exemplary threshold value of 4. That is, the output from an exemplary TLG will be equal to, for example, a value "1" if, an only if, at least four out of five inputs applied concurrently thereto are equal to the value "1"; otherwise the TLG will output a "0".

It is to be understood that the parity bit of the above-mentioned 4-bit group, and the quality bit associated with that parity bit, are not used directly in the decision making process of TLGs 21-23 since this parity bit was already used by syndrome generator 14 in performing its syndrome computations for these 3 data bits. The output signals from TLG 21-23, indicating the decision on the accuracy of the 3 data bits of the 4-bit group, which outputs can be denoted as data correction outputs $C_1$-$C_3$, are subsequently applied as separate inputs to EX-Or gates 28-30, respectively, in conjunction with the corresponding detected data bit memory storage registers 25-27, respectively. In particular, data correction output signal C1 from TLG 21 is applied as an input to EX-OR gate 28, data correction output signal C2 from TLG 22 is applied as an input to EX-OR gate 29, and data correction output signal C3 from TLG 23 is applied as an input to EX-OR gate 30. Each EX-OR gate 28-30 is also responsive to an associated one of the three data bits which have been appropriately delayed by memory storage registers 25-27, respectively. Since the decoding process must wait until the first syndrome bit associated with the current data group propagates through the 20 bit locations forming the syndrome register 16 and occupies bit location 0 of the syndrome register, the data bits of that group must likewise be subjected to a 20-clock cycle delay in memory storage registers 25-27 prior to being applied as separate inputs to EX-OR gates 28-30, respectively. Therefore, as shown in FIG. 1, each data bit from register 15 is applied as an input to a separate one of the memory storage registers 25-27, where each memory storage register functions to delay the associated data bit and suspend processing thereon until the associated first syndrome bit reaches the last bit location 0, of syndrome register 16. Hence, each EX-OR gate 28-30 receives as simultaneous inputs both a data correction bit $C_i$ from the associated TLG 21-23 and the associated data bit from memory storage registers 25-27.

In accordance with the EXCLUSIVE-OR function, the output of EX-OR gate 28, 29 or 30, designated $X_1$-$X_3$, respectively, will be equal to the value "1" if and only if either the associated received data bit $R_1$-$R_3$ or the data correction bit $C_1$-$C_3$ is equal to "1", but not both are equal to "1", otherwise the output will be equal to "0". The output of each EX-OR gate will hereinafter be defined as a corrected data bit $X_1$-$X_3$. Table I below shows the relation between $C_i$, $R_i$ and $X_i$.

TABLE I

| $C_i$ | $R_i$ | $X_i$ | Explanation |
|---|---|---|---|
| 0 | 0 | 0 | uncorrected data bit |
| 0 | 1 | 1 | uncorrected data bit |
| 1 | 0 | 1 | corrected data bit |
| 1 | 1 | 0 | corrected data bit |

As seen by reference to Table I, a received data bit $R_i$ is corrected only when data correction bit $C_i$ is equal to the value "1", that is, when at least three elements of the associated syndrome equation shown in Eq. (1) plus the associated quality bit are equal to "1" or all four elements of the associated syndrome equation are equal to "1" and the quality bit is equal to "0".

The set of Threshold Logic Gates 21-23, EX-OR gates 28-30 and memory storage registers 25-27, therefore, function to correct each of the three data bits of the original 4-bit group, with the corrected bit $X_1$-$X_3$ being delivered to a shift register 32 for serial output in a signal X(D) to the end user.

The outputs, $C_1$-$C_3$, from TLG 21-23 are also transmitted to syndrome register 16, with each of the signals from TLG 21-23 being applied to the input of a separate three of EX-OR gates S1-S19, forming a part of syndrome register 16, in accordance with the associated syndrome equation shown in exemplary Eq. (1). More particularly, the output from TLG 21 is related to bit 1 of the originally received 3 data bits and, according to Eq. (1), is affected by syndrome bits 0 (associated with this group of data bits) and syndrome bits 3, 15 and 19 associated with later groups of 4-bits. Similarly, the output from TLG 22 associated with the second bit of the 4-bit group is affected by syndrome bit 0 (associated with this group of data bits) and syndrome bits 8, 17 and 18 associated with later groups of 4-bits. Likewise, the output from TLG 23 associated with the third bit of the 4-bit group is affected by syndrome bit 0 (associated with this group of 4-bits) and syndrome bits 6, 11 and 13 associated with later groups of 4-bits.

These outputs, $C_1$-$C_3$, from TLG 21-23 can be termed syndrome correction bits which are fed back to syndrome register 16, as explained hereinbefore, to correct associated syndrome bits before they are shifted into their subsequent position in syndrome register 16. More particularly, a syndrome correction bit $C_i$ equal to "1" usually indicates that the four syndrome bits which were applied to the inputs of the associated TLG were true indicators of the incorrect state of the associated data bit, and consequently are usually false indicators of the correct state of the remaining received data bits related thereto. A number of these data bits are included in later code groups and would, therefore, benefit by removal of these false indicators before they, in turn, are decoded. Therefore, the syndrome correction bit, from the associated TLG, is fed back to syndrome register 16 to correct the associated syndrome bit 5 (excluding bit 0) before they are shifted into their subsequent positions in syndrome register 16. Typically as seen in FIG. 1, the output from TLG 21, associated with the first data bit of a 4-bit group, is fed back to EX-OR gates S3, S15 and S19 of syndrome register 16, which EX-OR gates affect the associated syndrome bits 3, 15 and 19 as they are shifted during the next clock cycle. Similarly, the output from TLG 22 is fed back to EX-OR gates S8, S17 and S18 in syndrome register 16 and the output from TLG 23 is fed back to EX-OR gates S6, S11 and S13 in syndrome register 16 to affect those associated syndrome bits as they are shifted.

What is claimed is:

1. A decoder for convolutional self-orthogonal codes comprising:

means responsive to an input convolutional self-orthogonal encoded signal including a plurality of serially transmitted m-bit groups, for detecting data and parity bits included in each m-bit group and then generating a first output signal representative of each of said data and parity bits and a second output signal associated with each detected data and parity bit which is a comparison of the input signal level of each bit and a predetermined signal threshold level;

means responsive to the first output signal from the detecting means for verifying the parity of the detected data and parity bits associated with each m-bit group in conjunction with bits in other m-bit groups and generating a syndrome bit output signal indicative of the success or failure of such verification;

a multistage syndrome shift register for storing the syndrome bit output signals from the verifying means at an m-bit transmission rate;

means responsive to each second output signal of the detecting means associated with a data bit of an m-bit group and an associated predetermined selection of stored syndrome bits from the syndrome register for generating an associated information correction bit output signal for use in selected correction of the associated stored signals in the syndrome register; and means responsive to each information correction bit and an associated data bit from the first signal from the detecting means for generating a decoder output signal indicative of the most probable estimate of the associated data bit.

2. A decoder in accordance with claim 1 wherein the information correction bit generating means comprises:

a plurality of Threshold Logic Gates (TLG) corresponding in number to the number of data bits in each of the m-bit groups, each TLG being responsive to (a) a separate subset of J syndrome bits from the syndrome register in accordance with a separate syndrome equation associated with a predetermined code rate and constraint length convolutional self-orthogonal code used for encoding a k-bit data group into an m-bit group, and (b) a separate associated second output signal from the detecting means.

3. A decoder in accordance with claim 2 wherein each TLG is capable of generating an information correction bit which has (i) a first value if at least a predetermined number of said J syndrome bits and the associated second output signal have a first value and (ii) a second value if less than a predetermined number of said J syndrome bits and the associated second output signal have a first value.

4. A decoder in accordance with claim 1 wherein the decoder output signal generating means comprises a plurality of gating means corresponding in number to the number of data bits in an m-bit group which are each capable of generating (a) a first decoder output signal associated with a separate predetermined data bit of an m-bit group if the associated data bit from the first output signal from the detector means and the associated information correction bit have different values and (b) a second decoder output signal if the associated data bit from the first output signal from the detector means and the associated information correction bit have corresponding values.

* * * * *

UNITED STATES PATENT AND TRADEMARK OFFICE
CERTIFICATE OF CORRECTION

PATENT NO.   :   4,521,886
DATED        :   June 4, 1985
INVENTOR(S)  :   Peter M. Dollard and William Turin It is certified that error appears in the above-identified patent and that said Letters Patent is hereby corrected as shown below:

Column 7, line 26, after "m-bit" the word "group" should be inserted.

Signed and Sealed this

Twenty-second Day of October 1985

[SEAL]

Attest:

DONALD J. QUIGG

Attesting Officer

Commissioner of Patents and
Trademarks—Designate